(12) United States Patent
Fricker

(10) Patent No.: US 10,321,586 B1
(45) Date of Patent: Jun. 11, 2019

(54) MODULAR SOLID-STATE STORAGE SYSTEM

(71) Applicant: EMC Corporation, Hopkinton, MA (US)

(72) Inventor: Jean-Philippe Fricker, Mountain View, CA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 437 days.

(21) Appl. No.: 14/981,671

(22) Filed: Dec. 28, 2015

(51) Int. Cl.
*H05K 5/00* (2006.01)
*H05K 5/04* (2006.01)
*H05K 7/20* (2006.01)

(52) U.S. Cl.
CPC ............. *H05K 5/0069* (2013.01); *H05K 5/04* (2013.01); *H05K 7/20136* (2013.01)

(58) Field of Classification Search
CPC .... H05K 5/0069; H05K 7/20136; H05K 5/04; H05K 7/202
USPC .................................................. 361/695, 728
See application file for complete search history.

(56) References Cited

U.S. PATENT DOCUMENTS

| | | | |
|---|---|---|---|
| 7,791,890 B2* | 9/2010 | Ishida | H05K 7/1492 211/26 |
| 8,574,046 B2* | 11/2013 | Nishiyama | G06F 1/20 165/104.34 |
| 9,781,858 B2* | 10/2017 | Fricker | H05K 7/1489 |
| 2004/0001311 A1* | 1/2004 | Doblar | G06F 1/20 361/679.49 |
| 2006/0012950 A1* | 1/2006 | Shih | G06F 1/184 361/679.33 |
| 2010/0177465 A1* | 7/2010 | Lu | G06F 1/182 361/679.01 |
| 2016/0073544 A1* | 3/2016 | Heyd | G11B 33/128 361/679.31 |

* cited by examiner

*Primary Examiner* — Anthony M Haughton
*Assistant Examiner* — Yahya Ahmad
(74) *Attorney, Agent, or Firm* — Chamberlain, Hrdlicka, White, Williams & Aughtry

(57) ABSTRACT

A system including a chassis and a hardware module bay disposed in a front portion of the chassis. The hardware module bay is configured to accommodate one or more horizontally oriented hardware modules. The one or more horizontally oriented hardware module are slidably insertable into the hardware module bay. The system further includes a main printed circuit board (PCB) that includes a chipset for communication with a hardware module inserted into the hardware module bay and a midplane disposed between the main PCB and the hardware module bay. The midplane is configured to electrically interface the hardware module inserted into the hardware module bay with the main PCB, upon insertion of the at least one horizontally oriented hardware module.

10 Claims, 6 Drawing Sheets

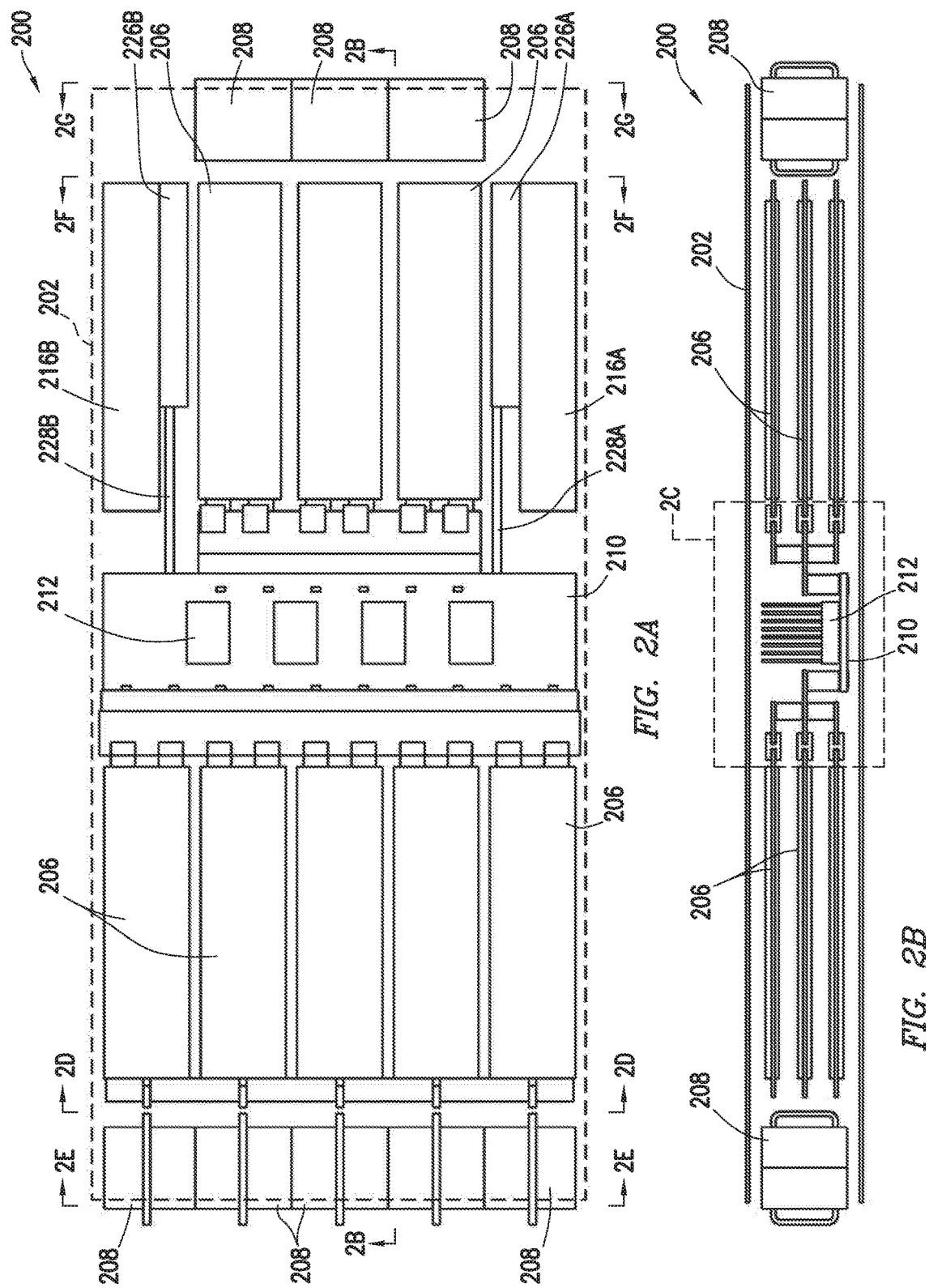

MODULAR SOLID-STATE STORAGE SYSTEM

BACKGROUND

Modular storage systems may house hardware modules such as storage modules, inserted into the modular storage system.

BRIEF DESCRIPTION OF DRAWINGS

FIGS. 2A-2G show storage assembly systems, in accordance with one or more embodiments of the technology.

DETAILED DESCRIPTION

Figure 1:
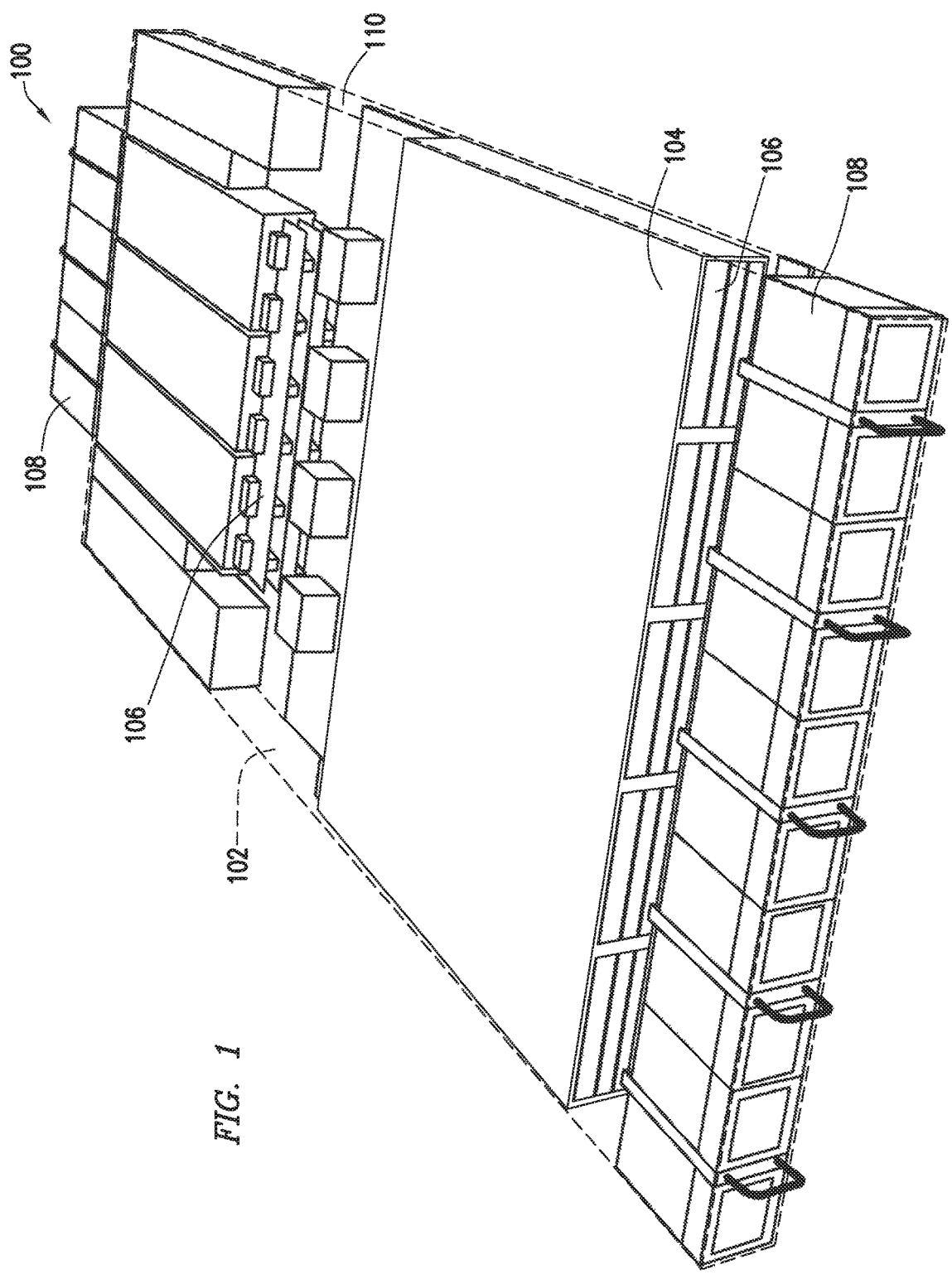
FIG. 1 shows a storage assembly system, in accordance with one or more embodiments of the technology.

Specific embodiments of the technology will now be described in detail with reference to the accompanying figures. Like elements in the various figures are denoted by like reference numerals for consistency.

In the following detailed description of embodiments of the technology, numerous specific details are set forth in order to provide a more thorough understanding of the technology. However, it will be apparent to one of ordinary skill in the art that the technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-3E, any component described with regard to a figure, in various embodiments of the technology, may be equivalent to one or more like-named components described with regard to any other figure. For brevity, descriptions of these components will not be repeated with regard to each figure. Thus, each and every embodiment of the components of each figure is incorporated by reference and assumed to be optionally present within every other figure having one or more like-named components. Additionally, in accordance with various embodiments of the technology, any description of the components of a figure is to be interpreted as an optional embodiment which may be implemented in addition to, in conjunction with, or in place of the embodiments described with regard to a corresponding like-named component in any other figure.

In general, embodiments of the technology are directed to modular solid-state storage systems. More specifically, one or more embodiments disclosed herein may be directed to the components housing the various elements of the solid-state storage system. For example, one or more embodiments disclosed herein relate to a rack-mount enclosure that may house insertable hardware modules, i.e., electronic circuit modules. Further, one or more embodiments disclosed herein relate to enclosures for the insertable electronic circuit modules, such as solid-state memory modules, compute modules, etc.

FIG. 1 shows a perspective view of a storage assembly system, where the top cover has been removed. The storage assembly system (100), in accordance with one or more embodiments of the technology, includes a chassis (102), a set of hardware module bays (104) configured to accommodate hardware modules (106), a set of fan modules (108) and a main printed circuit board (PCB) (110). Each of these components is described below.

The chassis (102) may be an enclosure, e.g., a metal case, that components, including the hardware modules (106), may be disposed within. In one or more embodiments of the technology, the chassis is configured to accommodate the hardware modules (106) and a number of additional components, described below. Further, the chassis (102) may be configured to dissipate heat, generated by the components in the chassis, and to provide shielding against electromagnetic interference (EMI). In the exemplary embodiment shown in FIG. 1 the chassis is one rack unit high.

A hardware module (106) may be a solid state storage module such a NAND Flash memory module, a NOR Flash memory module, a Magnetic RAM Memory (MRAM) module, a Spin Torque Magnetic RAM Memory (ST-MRAM) module, a Phase Change Memory (PCM) module, a memristive memory module, or any other memory module defined as a non-volatile Storage Class Memory (SCM) module. A hardware module may alternatively be a compute module, equipped with CPUs, GPUs, ASICs, FPGAs and/or other types of processors and may further include random access memory and/or other components of computing systems.

One or more hardware modules (106) may be disposed in the chassis (102) in a hardware module bay (104). In the exemplary embodiment shown in FIG. 1, horizontally oriented hardware modules (106) may be inserted into hardware module bays (104) of the chassis (102). Up to three hardware modules may be stacked in a hardware module bay (104), and up to five hardware module bays (104) may be adjacently placed in a front portion of the chassis (102). An additional three hardware module bays may be located in a rear portion of the chassis. Accordingly, in the exemplary embodiment shown in FIG. 1, the chassis (102) includes eight hardware module bays (104) that may accommodate up to 24 hardware modules (106).

In one embodiment of the technology, a hardware module bay (104) is equipped with sets of rails (not shown). A pair of rails may guide a hardware module (106), as it is slidably inserted into the hardware module bay (104). The hardware module (106) may be equipped with a set of slot cavities (not shown) that may accommodate the rails, as the solid state storage module is inserted into the storage system chassis.

In one or more embodiments of the technology, the rails are spaced such that air gaps are maintained between adjacent hardware modules (106), inserted into the hardware module bay (104), and between hardware modules and top and bottom walls of the hardware module bay. These gaps may allow airflow along the horizontal surfaces of the hardware modules (106).

In one or more embodiments of the technology, one or more fan modules (108) are disposed within a rear portion of the chassis. The one or more fan modules may be configured to pull air through the chassis (102) of the storage assembly system (100), e.g., through the gaps between the hardware modules (106) in the front portion of the chassis, through a central portion of the chassis where the main PCB (110) is located, and through the gaps between the hardware modules (106) in the rear portion of the chassis. The airflow may support convective cooling of the hardware modules (106) and of components on the main PCB (110).

In one embodiment of the technology, one or more fan modules (108) are further placed within a front portion of the chassis. The one or more fan modules may be configured to push air through the chassis (102). The fan modules (108) within the front portion of the chassis and the fan modules (108) within the rear portion of the chassis thus cooperate in generating an airflow through the chassis (102), thereby providing redundancy. The fan modules (108), in accordance with one or more embodiments of the technology, are equipped with metal screens, metal meshes, etc., which may enable air to flow there through, while also providing EMI containment.

In one embodiment of the technology, the hardware modules (106) are hot-pluggable, i.e., one or more hardware modules (106) may be exchanged during operation of the storage assembly system (100). Hot-plugging a hardware module (106) may require removal of one or more fan modules (108) located in front of (front-facing hardware modules) or behind (rear-facing hardware modules) the hardware module to be hot-plugged. Due to the redundancy of the front and rear fan modules (108), a fan module may be removed without compromising the thermal characteristics of the storage assembly system (100). For example, during a removal of a fan module in the front portion of the chassis to allow access to a hardware module, the fan modules in the rear portion of the chassis may sustain sufficient airflow to prevent overheating of components in the chassis.

Figure 2C:
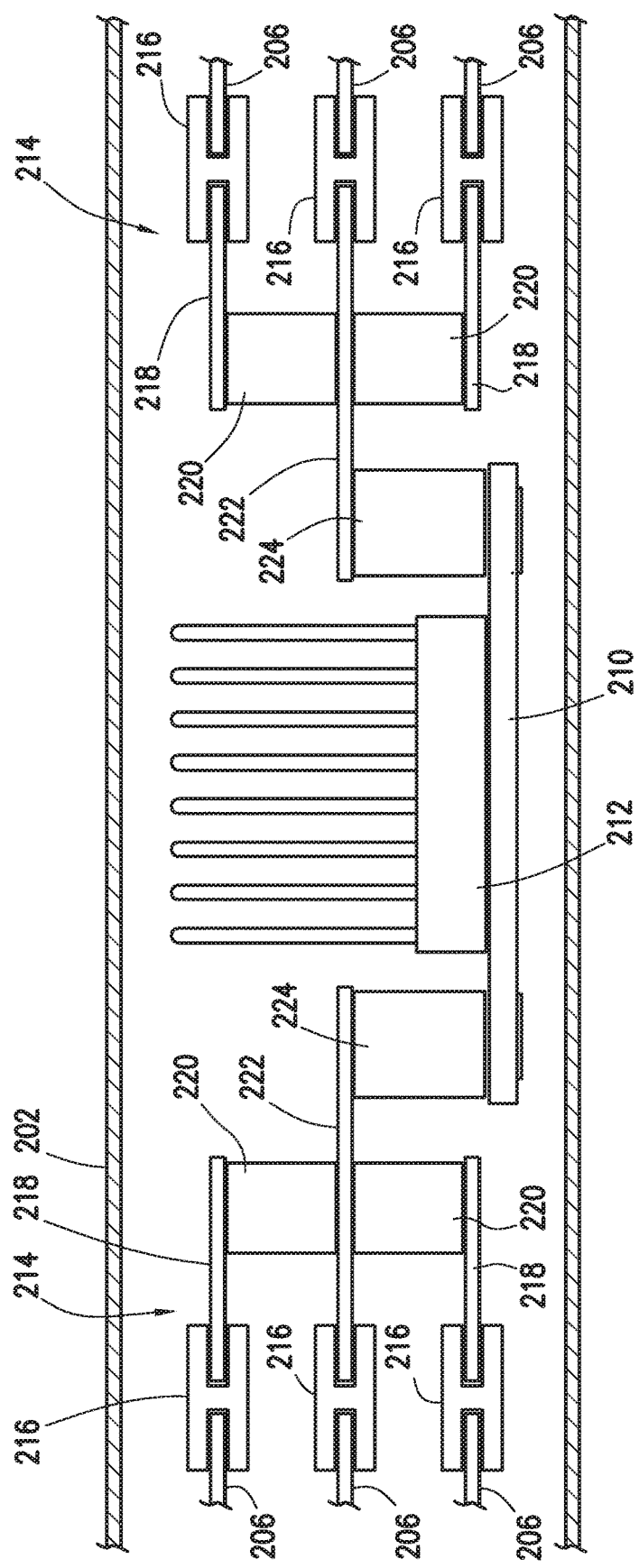
Figure 2D:
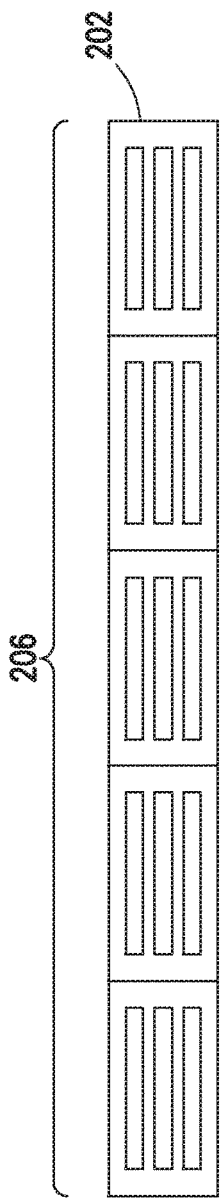
Figure 2E:
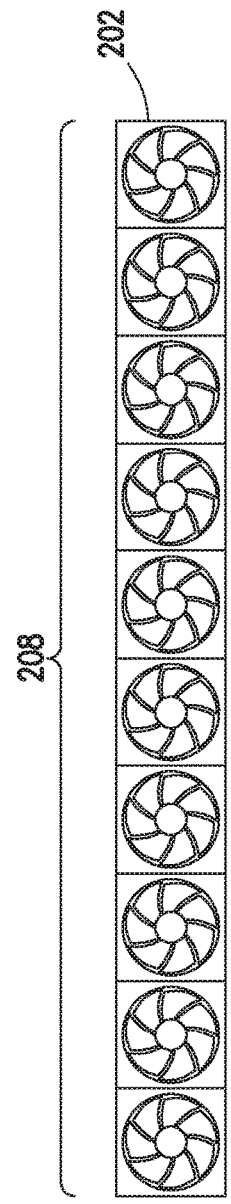
Figure 2F:
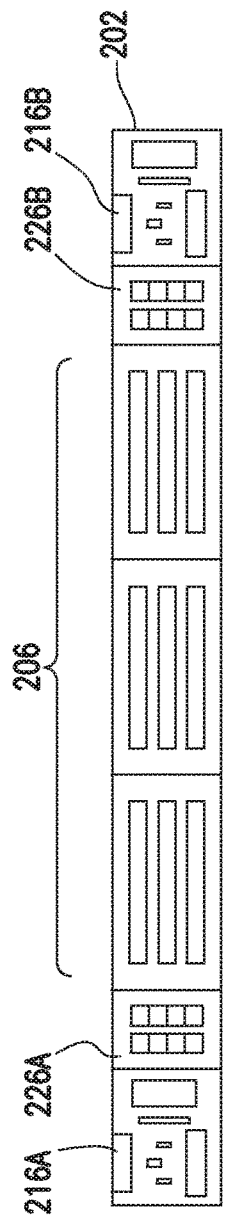
Figure 2G:
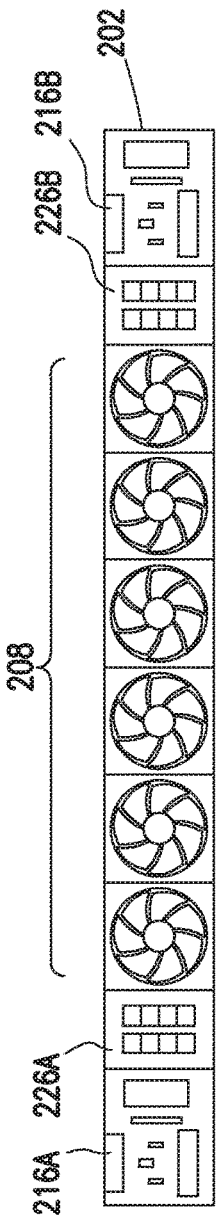

Referring to FIGS. 2A-2G, multiple views of a modular solid-state storage system (100) in accordance with one or more embodiments of the technology are shown. FIG. 2A shows a top view of the storage assembly system (200) in accordance with an embodiment of the technology, FIG. 2B shows a side view of the storage assembly system, FIG. 2C shows a detail side view of the storage assembly system, FIGS. 2D and 2E show front views of the storage assembly system with the fan modules removed and installed, respectively, and FIGS. 2F and 2G show rear views of the storage assembly system with the fan modules removed and installed, respectively.

As previously described, a storage system in accordance with an embodiment of the technology may include a chassis (202), hardware module bays (not shown in FIGS. 2A-2G), hardware modules (206), fan modules (208), and a main PCB (210). A chipset that may include multiple chips (212) may be located on the main PCB (210). The chipset may, for example, provide a communication interface to and from the hardware modules (206). The chassis may further house one or more power supplies. In the exemplary embodiments shown in FIGS. 2A-2G, two redundant power supplies (216A, 216B) are located in the rear portion of the chassis (202).

As illustrated in the detail view of FIG. 2C, stratified midplanes (214) may establish electrical interfaces between the hardware modules (206) and the main PCB (210). One stratified midplane (214) may be used to interface to a group of three hardware modules in a single hardware module bay (not shown). Each stratified midplane (214) may include three coplanar midplane PCBs, including a top and a bottom midplane PCB (218) and a center midplane PCB (222). The center midplane PCB (222) may electrically interface with the main PCB (210), and may distribute power and data signals to the center hardware module (206) and to the top and bottom hardware modules (206), via the top and bottom midplane PCBs (218), respectively. Electrical board-to-board connectors (216, 220, 224) may be used to connect the hardware modules (206) to the midplane PCBs (218, 222), the top and bottom midplane PCBs (218) to the center midplane PCB (222), and the center midplane PCB (222) to the main PCB (220), as illustrated in FIG. 2C. While the board-to-board connectors (216) are pluggable, thereby enabling insertion and removal of hardware modules (206), the board-to-board connectors (220, 224) may be either pluggable or non-pluggable. Those skilled in the art will recognize that any type of board-to-board connector suitable for transmitting power and/or data signals to/from the hardware modules (206) may be used. The board-to-board connectors (220, 224) may be, for example, mezzanine connectors. As can be seen in FIG. 2C, the height of these connectors may be selected such that proper spacing and alignment with the connectors of the hardware modules (206) is obtained. The board-to-board connectors (216) may be straddle connectors.

In an alternative embodiment of the technology, a stratified midplane (214) may not require a dedicated set of top, center and bottom midplane PCBs. Instead, the main PCB (210) may directly interface with one or more of the hardware module connectors, e.g., via straddle connectors. For example, the main PCB may include horizontally extending straddle connectors that may directly receive connectors of a hardware module (206). The main PCB may further include additional straddle connectors, e.g., right angled, horizontally oriented connectors that may thus receive connectors of additional hardware modules at different levels above and/or below the main PCB (210).

Those skilled in the art will recognize that the electrical interfaces between the main PCB (210) and the hardware modules (206) may be established using a variety of connecting elements, without departing from the technology. The connecting elements may include, for example, previously mentioned midplane PCBs and/or connectors of various types, including, but not limited to, straight and/or right angled card edge connectors, e.g., straddle connectors, or any other type of board-to-board connectors, including backplane connectors, mezzanine connectors, edge card connectors, etc.

In FIG. 2C, two stratified midplanes (214) are shown. The midplane depicted in the left half of FIG. 2C provides an interface to a set of up to three hardware modules in the front portion of the chassis, and the midplane depicted in the right half of FIG. 2C provides an interface to a set of up to three hardware modules in the rear portion of the chassis.

In one embodiment of the technology, the stratified midplanes are configured to electrically accommodate different communication protocols. For example, a hardware module (206) may use the Peripheral Component Interconnect Express (PCIe) or the Gigabit Ethernet (GbE) communication protocol via the same stratified midplane (214). Accordingly, the midplanes may be configured to support any of these communication protocols, for example, by providing a suitable number of data lines and by meeting other electrical requirements imposed by these communication protocols. The technology is not limited to the aforementioned protocols.

In one or more embodiments of the technology, the storage assembly system is further equipped with one or more chassis data connectors. Chassis data connectors may be used for communication with other equipment outside the storage assembly system. In the exemplary embodiments shown in FIGS. 2A, 2F and 2G, the chassis (202) is equipped with two chassis data connectors (226A, 226B). The chassis data connectors (226A, 226B) may be high density data connectors with numerous electric contacts and/or fiber-optic feedthroughs. The chassis data connectors may interface with the main PCB (210) via the chassis data connector wiring (228A, 228B). The chassis data connector wiring may include, for example, copper traces on a PCB extension of the main PCB (210), bundles of wires, and/or optical fibers.

One skilled in the art will recognize that the technology is not limited to the configurations described in FIGS. 1 and 2A-2G. For example, the chassis of a storage assembly system may accommodate a different number of hardware modules, without departing from the technology. While in the above-described embodiments a chassis that is one rack unit high accommodates 24 hardware modules, a larger chassis, e.g. a two rack unit high chassis, may accommodate a larger number of hardware modules. Further, the arrangement of components within the chassis may deviate from previously described exemplary embodiments without departing from the technology. For example, in one embodiment of the technology, the chassis does not accommodate hardware modules in the rear portion of the chassis. Instead, fan modules may be permanently installed in the rear portion of the chassis. Such a chassis may not require front fan modules and may thus allow removal of hardware modules without requiring prior removal of one or more fan modules. In addition, a storage assembly system, in accordance with one or more embodiments of the technology, may support any type of communication protocol including Peripheral Component Interconnect Express (PCIe), Gigabit Ethernet (GbE), Fibre Channel, InfiniB and, and/or any other communication protocol suitable for a hardware module inserted into the chassis. Similarly, the chassis data connectors may also support any type of communication protocol via electrical and/or optical media.

Figure 3A:
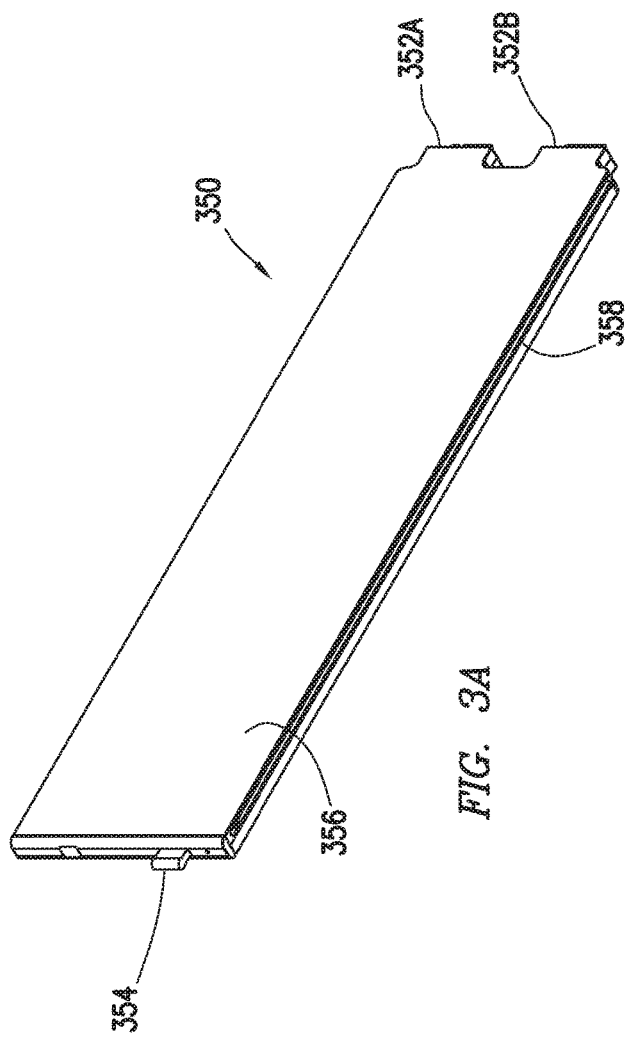
FIGS. 3A-3E show hardware modules, in accordance with one or more embodiments of the technology.

FIG. 3A shows a hardware module, in accordance with one or more embodiments of the technology. The hardware module (350) may include a housing (356) and a button (354) that enables a user to insert and remove the solid state storage module from the storage system chassis and further to mechanically lock and unlock the hardware module, inserted in a storage system chassis. In one or more embodiments of the technology, the housing (356) may form a cavity that may accommodate a printed circuit board including electronic circuits. If the hardware module (350) is a solid state storage module, the cavity may accommodate a printed circuit board (PCB) with solid state storage (e.g., NAND Flash memory, NOR Flash memory, Magnetic RAM Memory (MRAM), Spin Torque Magnetic RAM Memory (ST-MRAM), Phase Change Memory (PCM), memristive memory, or any other memory defined as a non-volatile Storage Class Memory (SCM)), and other integrated circuit components, capacitors, etc.), mounted thereon. If the hardware module (350) is a compute module, the cavity may accommodate a PCB with a processor (e.g., a CPU, GPU, FPGA, ASIC, etc.), random access memory (RAM), etc.

In one embodiments of the technology, the hardware module (350) may also include two connectors (352A, 352B). The two connectors may enable the hardware module to interface with the main PCB via the stratified midplanes as previously described with reference to FIGS. 2A-2G.

In one or more embodiments of the technology, the hardware module (350) further includes one or more slot cavities (358). If the hardware module includes two slot cavities, the slot cavities may be located on opposite sides of the solid state storage module, forming tracks to accommodate rails of a hardware module bay, when slidably inserting the hardware module into the hardware module bay, as previously described.

In one embodiment of the technology, the housing (356) of the hardware module (350) is made of Aluminum and acts as a heat sink. Those skilled in the art will appreciate that the housing may be made of any other material that functions to (i) dissipate heat and/or (ii) shield the internal components in the hardware module from electromagnetic interference (EMI). The housing may be made of other materials such as composites, alloys, or any other material that has high thermal conductivity. The selection of a specific material for the housing of the hardware module may vary based on the amount of heat the needs to be removed from the hardware module. Further, while the hardware module is described using a single material for the housing, different materials may be used, for example, such that one portion of the housing is made of a first material and a second portion of the housing is made of a second material.

The hardware module shown in FIG. 3A is a solo hardware module, in accordance with one or more embodiments of the technology. A solo hardware module, within the cavity of the solo hardware module, may provide sufficient space for a single PCB, as previously described. The dimensions of the solo hardware module, when horizontally inserted into a hardware module bay, may be 8.5×80×304 millimeters (height×width×depth). These dimensions may allow the stacking of three solo hardware modules in a chassis that is one rack unit high. A 2.75 mm gap may remain between solo hardware modules inserted into a hardware module bay. This gap may enable air to flow along the surfaces of the hardware modules for cooling. Five stacks of solo hardware modules with the above dimensions may be placed next to each other in a standard 19" wide chassis, as illustrated, e.g., in FIG. 1.

Figure 3B:
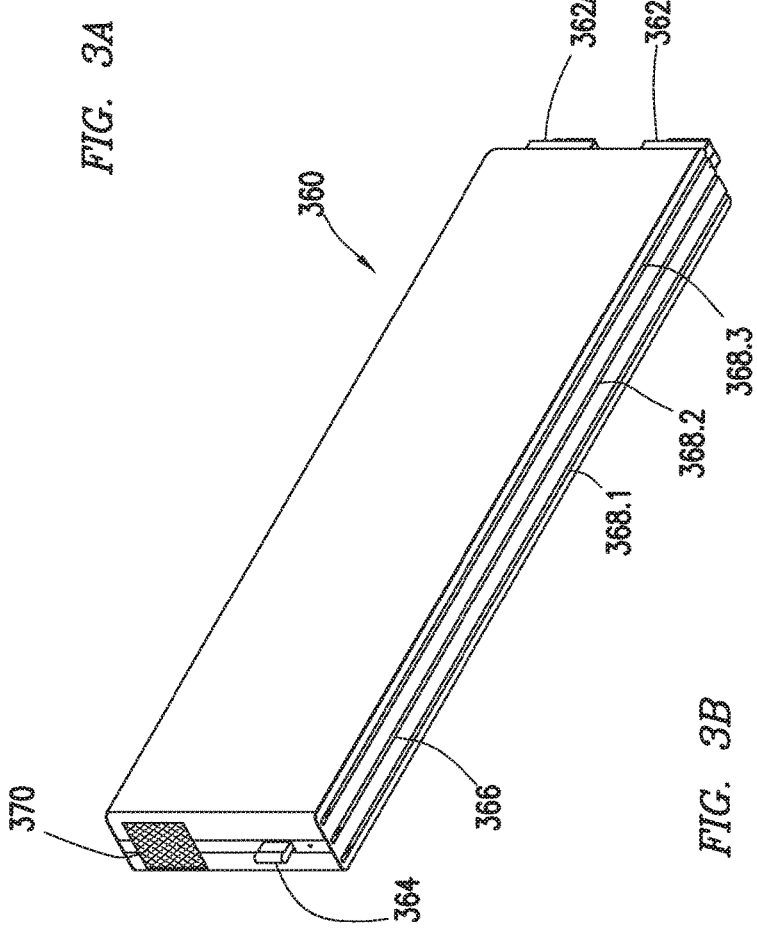

Turning to FIG. 3B, a triplet hardware module, in accordance with one or more embodiments of the technology, is shown. A triplet hardware module (360) may provide sufficient space for multiple PCBs, as described below with reference to FIGS. 3C-3E.

Analogous to the solo hardware module (350), shown in FIG. 3A, the triplet hardware module (360) may include a housing (366) and a button (364) that enables a user to insert and remove the solid state storage module from the storage system chassis and further to mechanically lock and unlock the triplet hardware module, inserted in the storage system chassis. The triplet hardware module may also include two connectors (362A, 362B). However, in contrast to the solo hardware module, the triplet hardware module may have additional connectors. In one embodiment of the technology, the triplet hardware module has six connectors. When such a triplet hardware module is inserted into a hardware module bay, all connectors of the stratified midplane that would otherwise interface with three solo hardware modules instead interface with the triplet hardware module. Circuitry within the triplet hardware module may thus benefit from the availability of additional bandwidth and/or electrical power, via the additional connectors.

In one or more embodiments of the technology, the hardware module (350) further includes one or more sets of slot cavities (368.1-368.3). These sets of slot cavities form tracks to accommodate the rails of a hardware module bay that would otherwise guide three separate solo hardware modules.

The dimensions of the triplet hardware module, when horizontally inserted into a hardware module bay, may be 31×80×304 millimeters (height×width×depth). These dimensions may correspond to the height of a stack of three solo hardware modules. Accordingly, a single triplet hardware module may be inserted into a hardware module bay that would otherwise accommodate three solo hardware modules.

In one embodiment of the technology, the triplet hardware module (360) includes ventilation openings (370) at the front and at the rear faceplate (not shown) of the triplet hardware module. The ventilation openings (370) may allow air to pass through the triplet hardware module. The ventilation openings may be, for example, small circular holes drilled into the front and rear faceplates of the triplet hardware modules, or larger openings, protected by a mesh. In one embodiment of the technology, the size and shape of the ventilation openings is chosen such that a triplet hardware module, inserted into a hardware module bay generates an airflow impedance (i.e., resistance to airflow), similar to the airflow impedance of three solo hardware modules inserted into a hardware module bay. Accordingly, the airflow pattern through a chassis of a storage assembly system may be the same, regardless of whether three solo hardware modules or one triplet hardware modules are inserted.

Those skilled in the art will appreciate that a duet hardware module (not shown) may be used in applications where a solo hardware module is not sufficient, but where the additional space for PCBs that a triplet hardware module provides is not necessary. The duet hardware module may be accommodated in a single hardware module bay, along with an additional solo hardware module.

Figure 3C:
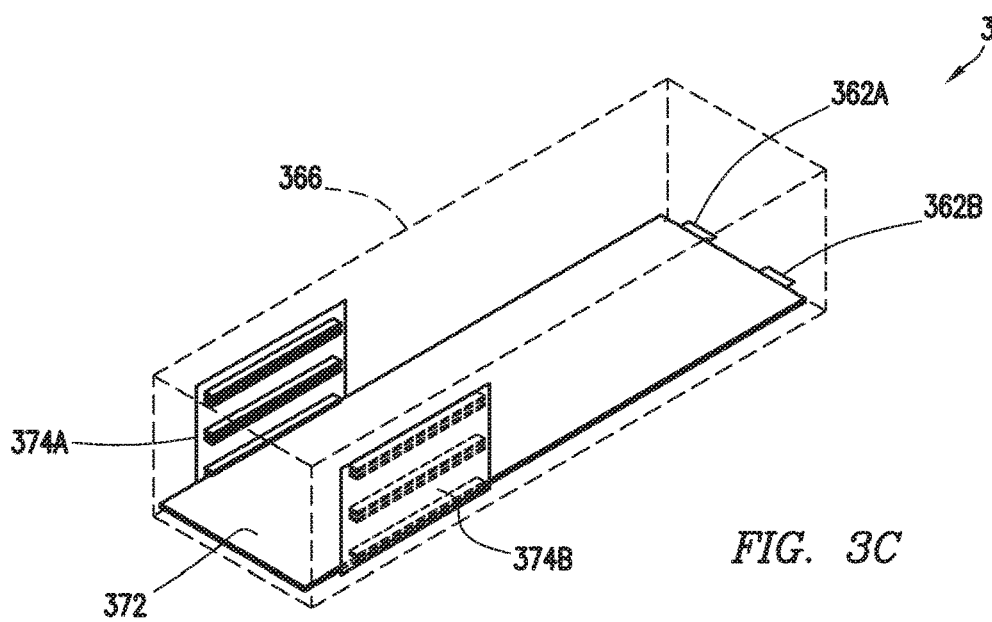
Figure 3D:
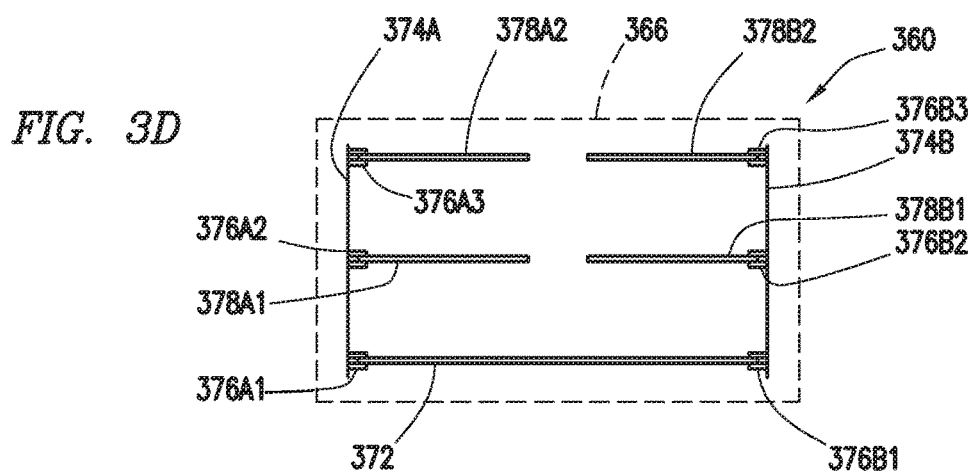
Figure 3E:
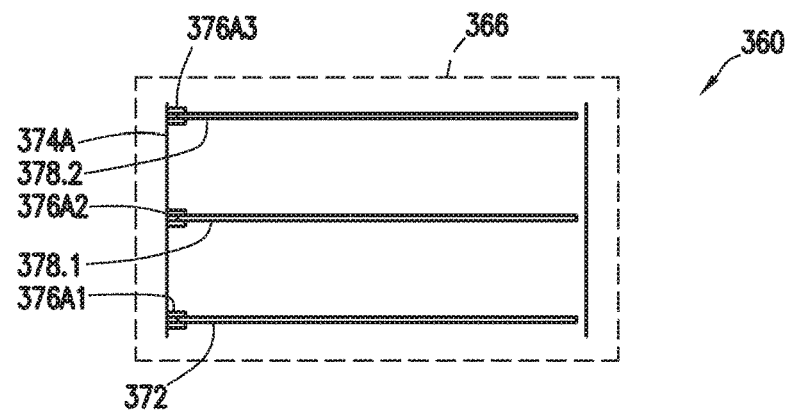

Turning to FIGS. 3C-3E, the interior of triplet hardware modules, in accordance with one or more embodiments of the technology, is shown. FIG. 3C shows a perspective view of the interior of a triplet hardware module, and FIGS. 3D and 3E show cross-sectional front views of triplet hardware modules, in accordance with one or more embodiments of the technology. A triplet hardware module (360) may include, within the housing (366), at least one hardware module main circuit board (372) and one or more vertical backplanes (374A, 374B).

Two vertical backplanes (374A, 374B) may be used, for example, if multiple smaller PCBs (also referred to as daughterboards) are to be accommodated in the housing (366) of the triplet hardware module (360), in addition to the hardware module main circuit board (372). This may be the case, for example, in a scenario in which the hardware module circuit board (372) accommodates a processor, and in which random access memory (RAM) is to be accommodated on the additional printed circuit boards (378A1, 378A2, 378B1, 378B2), as illustrated in FIG. 3D. In this case, the connectors (376A1, 376A2, 376A3, 376B1, 376B2, 376B3) may be, for example, Dual In-Line Memory Module (DIMM) slots, and the vertical backplanes (374A, 374B) may accommodate the memory bus between the DIMM slots. Connectors (376A2, 376A3, 376B2, 376B3) may accommodate DIMM memory modules, whereas connectors (376A1, 376A2) may connect the vertical backplanes (374A, 374B) to the hardware module main PCB (372).

Alternatively, a single backplane (374A) may be used, for example, if two larger PCBs are to be accommodated in the housing (366) of the triplet hardware module (360), in addition to the hardware module main circuit board (372). This may be the case, for example, in a scenario in which the hardware module circuit board (372) accommodates a processor, and random access memory (RAM), and in which additional communication interfaces are to be accommodated on the additional printed circuit boards (378.1, 378.2), as illustrated in FIG. 3E. PCB (378.1) may be, for example an Infiniband communication board, and PCB (378.2) may be, for example a Fibre Channel communication board. Both of these boards (also referred to a daughterboards) may interface with the hardware module main circuit board (372) via the vertical backplane (374A). The connectors (376A1, 376A2, 376A3), in this case, may be, for example, PCIe connectors, and the vertical backplane (374A may accommodate the PCIe bus between the PCIe connectors. To enable the Infiniband and the Fibre Channel communication boards to communicate with the environment outside the hardware module, both PCBs (378.1, 378.2) may be equipped with connectors similar to the connectors (362A, 362B) on the hardware module main PCB (372). Accordingly, this triplet hardware module may have six connectors interfacing with the stratified midplane.

Those skilled in the art will recognize that the technology is not limited to the above examples. Any type of circuit may be accommodated on the hardware module main circuit board and may be extended by any type of circuit on one or more daughterboards. The nature of the circuits may determine the types of connectors on the vertical backplane(s) and the bus(es) on the vertical backplane(s) that connect the daughterboard(s) to the main circuit board. Duet hardware modules may be implemented analogous to triplet hardware modules and may include one rather than two layers of daughterboards.

Embodiments of the technology may enable a compact modular solid state storage system that may accommodate a large number of hardware modules, such as solid state storage modules. The hardware module bays of the solid state storage system may accommodate hardware modules of various sizes. For example, the hardware module bays of a solid state storage system may accommodate 24 solo hardware modules, eight triplet hardware modules, or other combinations of solo, duet and/or triplet hardware modules. In one embodiment of the technology, the computing power of the storage assembly system is customizable. The storage assembly system may, for example be equipped with solid state storage modules only, or it may accommodate a combination of solid state storage modules and compute modules. Depending on the computational and/or storage needs, an appropriate combination of solid state storage hardware, compute hardware and/or other hardware may be custom-selected. Further, depending on the spatial requirements of the selected hardware to be used, the hardware may be provided in a solo, duet and/or triplet hardware module. Modular stolid state storage systems, in accordance with one or more embodiments of the technology, thus enable the custom-configuration of high density, high capacity, compact storage systems.

While the technology has been described with respect to a limited number of embodiments, those skilled in the art, having benefit of this disclosure, will appreciate that other embodiments can be devised which do not depart from the scope of the technology as disclosed herein. Accordingly, the scope of the technology should be limited only by the attached claims.

What is claimed is:
1. A system comprising:
   a chassis;
   a hardware module bay disposed in a front portion of the chassis, wherein the hardware module bay is configured to accommodate at least a first horizontally oriented hardware module and a second horizontally oriented hardware module, wherein the first horizontally oriented hardware module is slidably insertable into a center location of the hardware module bay, wherein the second horizontally oriented hardware module is slidably insertable into one selected from a group consisting of a top location and a bottom location, of the hardware module bay;

a main printed circuit board (PCB) comprising a chipset for communication with a hardware module inserted into the hardware module bay; and a midplane disposed between the main PCB and the hardware module bay, wherein the midplane is configured to electrically interface at least the first and second horizontally oriented hardware modules, inserted into the hardware module bay, with the main PCB upon insertion of at least the first and second horizontally oriented hardware modules, wherein the midplane comprises:

a center midplane PCB disposed coplanar to the first horizontally oriented hardware module; and one selected from a group consisting of a top midplane PCB and a bottom midplane PCB, disposed coplanar to the second horizontally oriented hardware module, wherein the center midplane PCB electrically interfaces with the main PCB through a first board-to-board connector and is configured to provide an electrical interface between the main PCB and the first horizontally oriented hardware module, wherein the one selected from the group consisting of the top midplane PCB and the bottom midplane PCB, electrically interfaces with the center midplane PCB through a second board-to-board connector and is configured to provide an electrical interface between the center midplane PCB and the second horizontally oriented hardware module.

2. The system of claim 1, wherein the chassis is a rack-mount chassis.

3. The system of claim 2, wherein the rack-mount chassis is one rack unit high.

4. The system of claim 1, wherein the midplane electrical interface comprises a power and a data interface.

5. The system of claim 1 further comprising a fan module, wherein the fan module is disposed in a rear portion of the chassis.

6. The system of claim 5, wherein the hardware module bay is further configured to accommodate the at least one horizontally oriented hardware module such that gaps are provided above and below the at least one hardware module, and wherein an airflow generated by the fan module passes along the upper and lower horizontal surfaces of the at least one hardware module, through the gaps.

7. The system of claim 1, further comprising:

a power supply configured to power at least one selected from a group consisting of the first horizontally oriented hardware module and the second horizontally oriented hardware module.

8. The system of claim 1, further comprising:

a hardware module bay disposed in a rear portion of the chassis.

9. The system of claim 8 further comprising:

a removable front fan module, disposed in front of the hardware module bay disposed in the front portion of the chassis; and a removable rear fan module disposed behind the hardware module bay disposed in the rear portion of the chassis.

10. The system of claim 9, wherein the removable front fan module and the removable rear fan module redundantly generate an airflow through the chassis.

* * * * *